United States Patent [19]

Ahlert et al.

[11] Patent Number: 5,149,409
[45] Date of Patent: Sep. 22, 1992

[54] PROCESS FOR FABRICATING THIN FILM METAL ALLOY MAGNETIC RECORDING DISKS TO SELECTIVELY VARIABLE COERCIVITIES

[75] Inventors: Richard H. Ahlert, San Jose; James K. Howard, Morgan Hill; Steven E. Lambert, San Jose, all of Calif.

[73] Assignee: International Business Machines Corporation, Armonk, N.Y.

[21] Appl. No.: 640,182

[22] Filed: Jan. 11, 1991

[51] Int. Cl.$^5$ .............................................. C23C 14/34
[52] U.S. Cl. ................................................... 204/192.2
[58] Field of Search ...................................... 204/192.2

[56] References Cited

U.S. PATENT DOCUMENTS

| 4,552,820 | 11/1985 | Lin et al. | 428/611 |
| 4,610,911 | 9/1986 | Opfer et al. | 428/213 |
| 4,652,499 | 3/1987 | Howard | 428/641 |
| 4,654,276 | 3/1987 | Ahlert et al. | 428/641 |
| 4,749,459 | 6/1988 | Yamashita et al. | 204/192.15 |
| 4,803,130 | 2/1989 | Skorjanec et al. | 204/192.2 |
| 4,863,811 | 9/1989 | Ueda et al. | 428/694 |
| 4,900,622 | 2/1990 | Nakayama et al. | 428/336 |

FOREIGN PATENT DOCUMENTS

| 61-234021 | 10/1986 | Japan | 204/192.2 |
| 63-213657 | 9/1988 | Japan | 204/192.2 |
| 1122488 | 5/1989 | Japan | 204/192.2 |

OTHER PUBLICATIONS

Khan et al., *IEEE Transactions on Magnetics*, vol. 24, pp. 2985-2987 (1988).
Awano et al., *IEEE Transactions on Magnetics*, vol. 23, pp. 2067-2069 (1987).
Mapps et al., *IEEE Transactions on Magnetics*, vol. 23, pp. 2473-2475 (1987).

*Primary Examiner*—Aaron Weisstuch
*Attorney, Agent, or Firm*—Thomas R. Berthold

[57] ABSTRACT

In the fabrication of thi film cobalt alloy magnetic recording disks by sputter-deposition, the coercivity of the disks can be selectively varied by introducing a predetermined amount of hydrocarbon gas, such as methane, into the argon-based sputtering atmosphere. The flow rate of the hydrocarbon gas into the sputtering chamber is directly related to the coercivity of the resulting disks. This permits the coercivity of the disks to be controlled without the necessity of changing the composition of the cobalt alloy sputtering targets, and without the necessity of changing the thickness of an underlying between the disk substrate and the magnetic layer. The use of hydrocarbon gas in the reactive sputtering of the cobalt alloy magnetic layer in the disks does not affect the intrinsic media noise of the disks, thus allowing for the manufacturing of disks with high signal-to-noise ratio (SNR) of the readback signal.

6 Claims, 4 Drawing Sheets

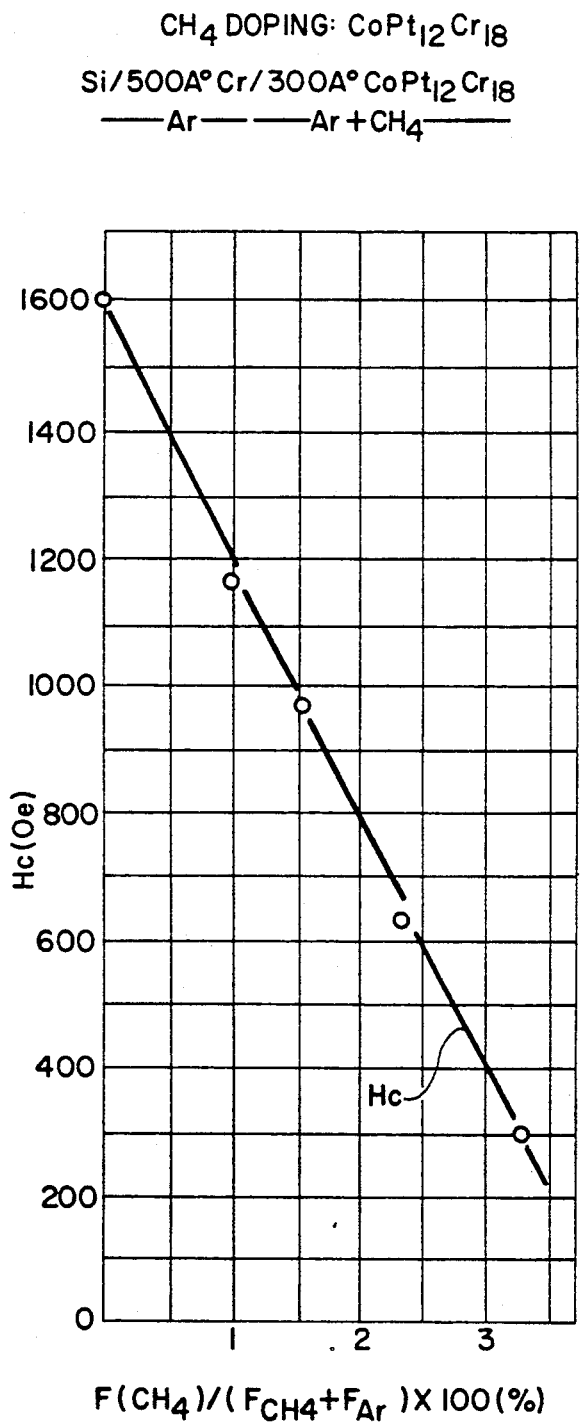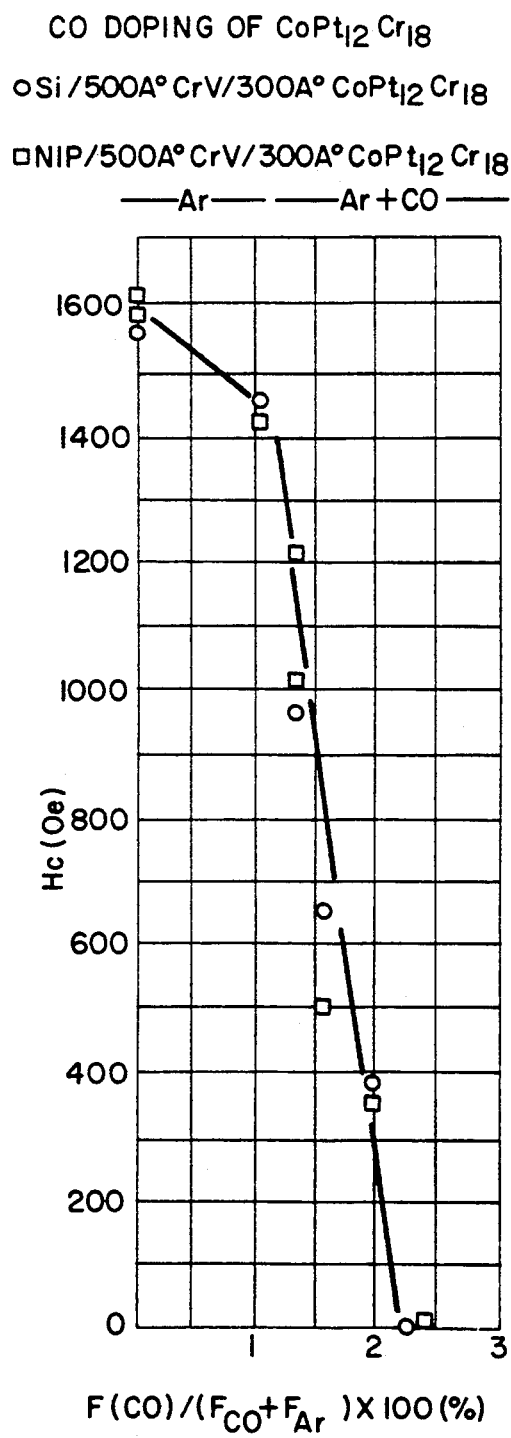
FIG. 2
FIG. 3

PROCESS FOR FABRICATING THIN FILM METAL ALLOY MAGNETIC RECORDING DISKS TO SELECTIVELY VARIABLE COERCIVITIES

TECHNICAL FIELD

This invention relates to a process for the manufacture of thin film metal alloy magnetic recording disks and in particular to a process whereby such disks can be manufactured to predetermined coercivities.

BACKGROUND OF THE INVENTION

Thin film metal alloy magnetic recording disks typically comprise a substrate, such as an aluminum-magnesium (AlMg) alloy with a nickel-phosphorous (NiP) surface coating, a cobalt-based alloy sputter-deposited as a magnetic layer on the substrate, and a protective overcoat, such as a sputter-deposited amorphous carbon film, formed on the magnetic layer. A general description of the structure of such thin film disks is given in Opfer et al. U.S. Pat. No. 4,610,911 and Lin et al. U.S. Pat. No. 4,552,820.

The coercivity (Hc) is an important factor in the design of such disks. Where high magnetic recording density is required, it is desirable to have a high coercivity limited only by the write capability of the recording head. In addition, it is desirable to have low intrinsic media noise so that the resulting readback signal has a high signal-to-noise ratio (SNR).

One of the problems in the manufacture of such disks is that it has not been previously possible to easily vary the coercivity of such disks to achieve a predetermined value of coercivity. One conventional approach to manufacture a disk having a selected coercivity is to vary the composition of the sputtering target. For example, Opfer, et al. U.S. Patent 4,610,911, describes varying the platinum content in a cobalt-platinum (CoPt) alloy disk so as to vary the coercivity. This method has the inherent disadvantage that it requires that the manufacturing line be shut down so that a new sputtering target can be inserted into the sputtering chamber. Another technique for selectively varying the coercivity is to use underlayers between the disk substrate and the magnetic layer, which results in an enhancement of the magnetic properties, including the coercivity, of the subsequently deposited magnetic layer. This technique is described in assignee's U.S. Pat. Nos. 4,654,276 and 4,652,499 wherein tungsten (W) and an alloy of chromium-vanadium (CrV), respectively, are suggested as the enhancement or nucleation layers to improve the coercivity of the disks.

Reactive sputtering gases, such as nitrogen-containing and oxygen-containing gases, have been used as dopants for cobalt-based alloy disks (CoNiPt, CoPtCr, CoCrTa) to adjust the coercivity over a desired range and to attain several coercivity objectives from a single sputtering target. The doping of the cobalt-based magnetic film is achieved by sputtering the magnetic film (or both the underlayer film and the magnetic film) in a mixture of argon (Ar) and the reactive gas (e.g. $O_2$, $N_2$, $H_2O$ vapor). In this regard, Yamashita, et al. U.S. Pat. No. 4,749,459 describes a sputtering process using $N_2$, or a gas such as $H_2O$ vapor which dissociates to release oxygen, to vary the coercivity of CoPt alloy disks. Khan, et al. in *IEEE Transactions on Magnetics*, Vol. 24, No. 6, Nov. 1988 (pp. 2985-2987) teaches the use of $O_2$, $N_2$ and $H_2O$ vapor to control the coercivity of CoCrTa alloy disks. The problem with the use of reactive sputtering of cobalt-based alloy films in the presence of nitrogen-containing and oxygen-containing gases is that it is not possible to predict the effect of the sputtering process on the intrinsic media noise, and thus the resulting SNR, of the completed disk.

SUMMARY OF THE INVENTION

The invention is a process for selectively varying the coercivity of thin film cobalt-based alloy disks without changing the sputtering target composition and without substantially affecting the SNR. The process involves introducing a hydrocarbon gas (such as $CH_4$) into the sputtering atmosphere during the sputter-deposition of the cobalt alloy magnetic layer. It has been found that the coercivity of disks of the same thickness and cobalt alloy composition is inversely related to the amount of hydrocarbon gas introduced into the sputtering atmosphere. The process is also applicable in the fabrication of those thin film metal alloy disks in which an underlayer is desired. The hydrocarbon ($CH_4$) doping process is most applicable to the modern single disk (static deposition) sputtering system in which each phase of the process (undercoat, magnetic layer, overcoat, etc.) takes place in vacuum isolated chambers to eliminate cross-contamination of reactive gases. However, the process is also applicable in a continuous production type in-line sputtering system, wherein all of the disk layers are deposited in a single sputtering chamber. This is because the hydrocarbon gas, which is necessary to control the coercivity of the resulting disk, has no adverse affect on the formation of any of the other films in the disk structure when present in relatively low levels.

For a fuller understanding of the nature and advantages of the present invention reference should be made to the following detailed description taken in conjunction with the accompanying drawings.

BRIEF DESCRIPTION OF THE DRAWINGS

FIG. 2 is an illustration of Hc as a function of $CH_4$ flow rate for various $Co_{78}Pt_{12}Cr_{10}$ disk structures;

FIG. 3 is an illustration of Hc as a function of CO flow rate for various $Co_{70}Pt_{12}Cr_{18}$ disk structures;

DESCRIPTION OF THE PREFERRED EMBODIMENTS

The use of a hydrocarbon gas as a reactive gas to control coercivity in the sputtering of cobalt-based alloy disks occurred during an investigation of the adverse effects on SNR by the use of an oxygen-containing gas (CO) as the reactive sputtering gas. It was suspected that the cause of unpredictable or undesirable SNR values which occurred with the use of CO was due to the fact that CO would dissociate in a plasma and produce C and O reactive components, each of which exhibits different reactivities as functions of flow rates, temperature, etc.. For comparison, $CH_4$ was investigated as the dopant gas because it would dissociate into different species, namely C and H, and it was believed that H would not significantly affect the magnetic properties of a CoPtCr film.

Experiments were performed in an SFI research S-gun magnetron sputtering system. The substrates consisted of silicon (Si) or AlMg/NiP disks onto which a 500 Angstrom Cr film was deposited in an Ar plasma. A $Co_{78}Pt_{12}Cr_{10}$ magnetic layer was then sputtered onto the Cr underlayer in a mixture of CO and Ar. The composition of the gas (%) was determined from the flow rate ratio:

$$\frac{F(CO)}{F(CO) + F(Ar)} \times 100 = \% \ CO,$$

where F(CO) is flow rate of CO in standard cubic centimeters per minute (sccm) and F(Ar) is the flow rate of Ar.

Figure 1:
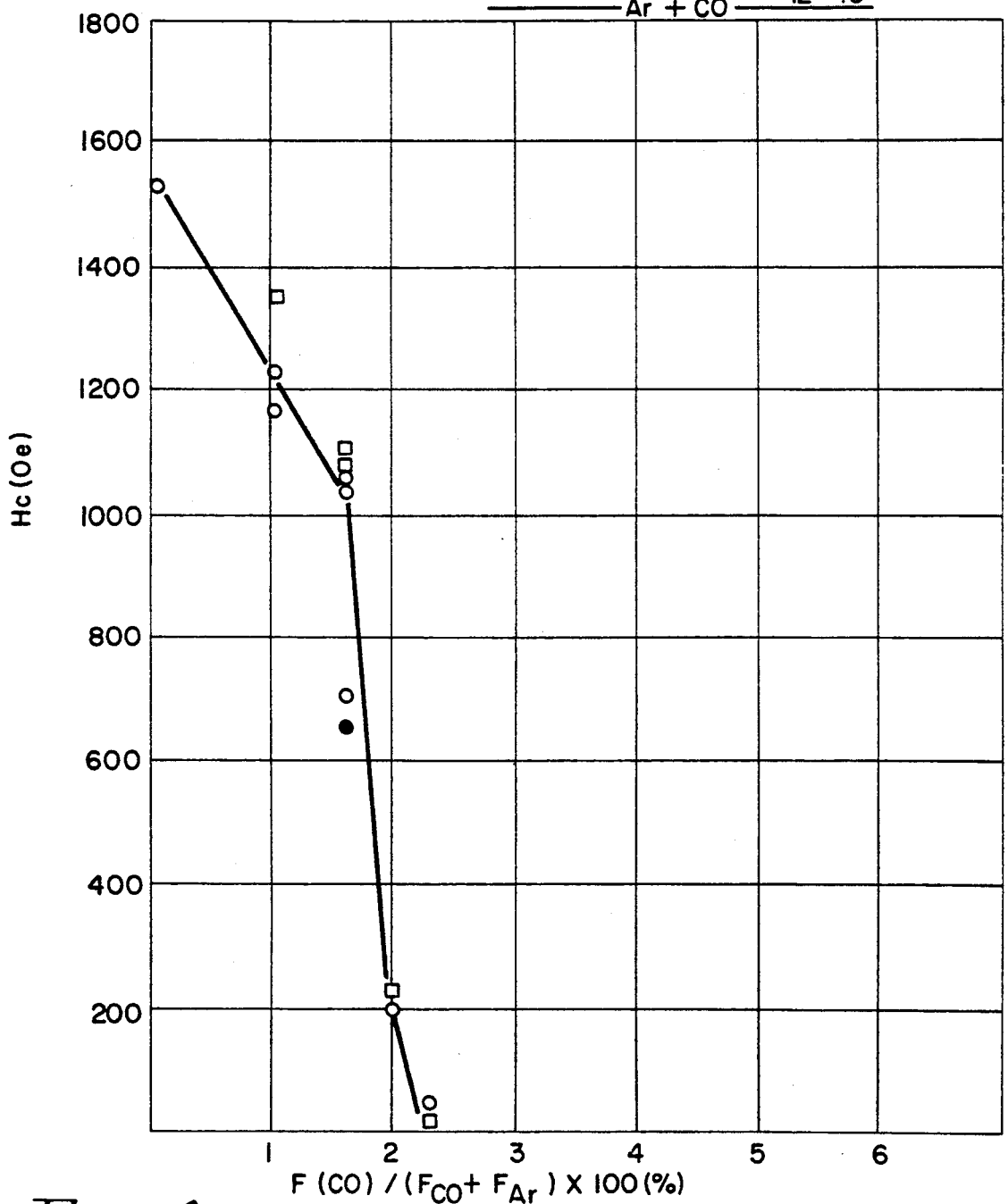
FIG. 1 is an illustration of Hc as a function of CO flow rate for various $Co_{78}Pt_{12}Cr_{10}$ disk structures.

FIG. 1 depicts the dependence of Hc on % CO in the plasma for both Si and AlMg/NiP substrate structures. Note that Hc is reduced linearly with % CO until about 1.5-1.6% CO and then drops rapidly until it is essentially extinguished (Hc<100 Oe) at about 2.2% CO. The entire Cr/CoPtCr disk structure was also sputtered in Ar—CO and achieved results similar to that when only the magnetic layer was sputtered in Ar—CO.

The Cr and $Co_{78}Pt_{12}Cr_{10}$ targets were then cleaned and the above experiment repeated in the same manner using $CH_4$ to replace CO as the reactive sputtering gas. FIG. 2 shows that Hc decreases linearly with % $CH_4$ from 1600 Oe to about 300 Oe. The Hc control was very repeatable by adjusting the % $CH_4$ in the plasma.

Figure 4:
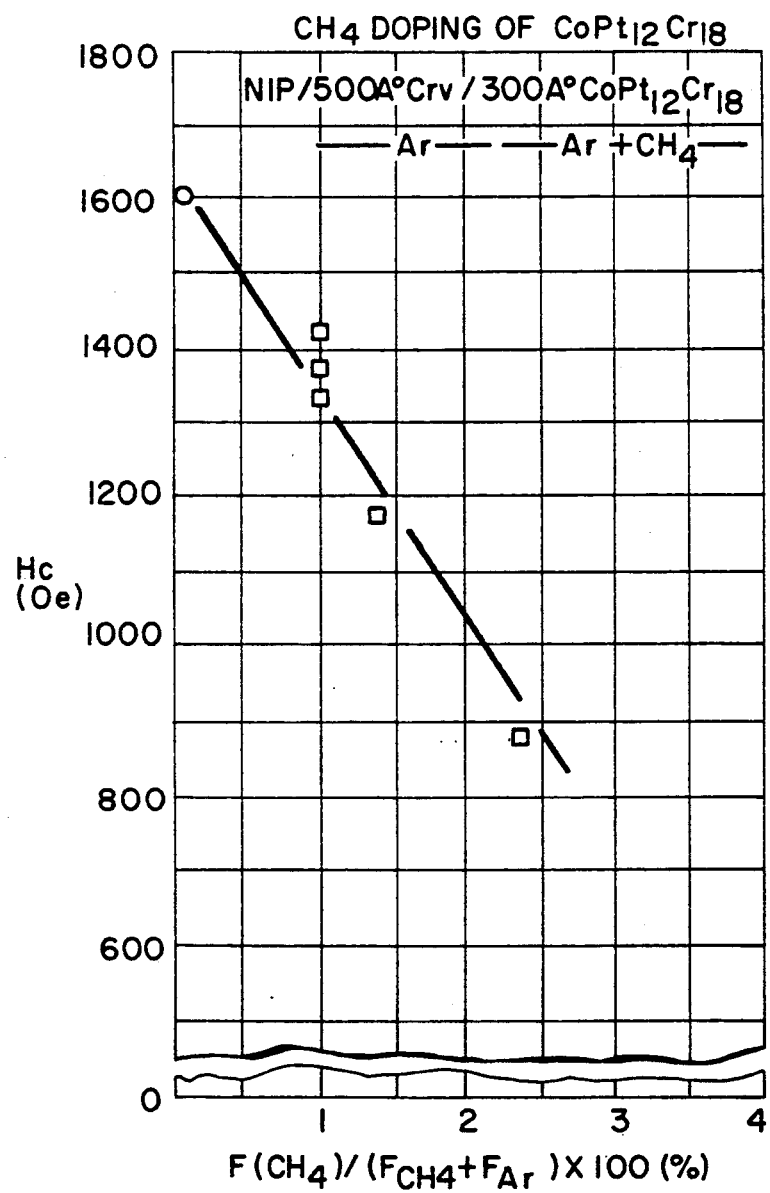
FIG. 4 is an illustration of Hc as a function of $CH_4$ flow rate for various $Co_{70}Pt_{12}Cr_{18}$ disk structures.

The differences in the CO/$CH_4$ effects were also investigated for different CoPtCr composition targets and underlayer structures. FIG. 3 depicts the dependence of Hc on % CO for 500 Å CrV/300 Å $Co_{70}Pt_{12}Cr_{18}$ structures in which only the CoPtCr film was sputtered in Ar—CO. The non-linear response is similar to that observed in FIG. 1 although the critical % CO (onset of rapid Hc decrease) is about 1% CO for $Co_{70}Pt_{12}Cr_{18}$ compared to about 1.5% CO for $Co_{78}Pt_{12}Cr_{10}$ (FIG. 1). FIG. 4 shows that the Hc dependence on % $CH_4$ appears to be linear over the range tested of the $Co_{70}Pt_{12}Cr_{18}$ alloy.

To compare the effect of CO and $CH_4$ doping on SNR the 500 Å CrV/300 Å $Co_{70}Pt_{12}Cr_{10}$/200 Å H:C disk structures (where H:C represents a hydrogenated carbon protective overcoat) were fabricated on both textured and polished AlMg/NiP substrates. The gas mixtures were chosen to produce Hc values in the 1175-1400 Oersted (Oe) range. The SNR data, measured as the ratio of the amplitude of isolated pulses (So) to the RMS media noise voltage (Nm) at 2000 flux reversals/millimeter (fr/mm), for the CO and $CH_4$ doped disk structures (FIG. 5) shows that $CH_4$ has little or no effect on SNR over the range of gas mixtures tested. However, doping with CO causes a significant reduction in SNR (approximately 3-4 dB). The values for textured and smooth substrates are also similar, showing that roughness does not affect SNR over the range tested. Although the results in FIG. 5 were obtained at 2000 fr/mm, similar effects were measured at 3000 fr/mm.

Figure 5:
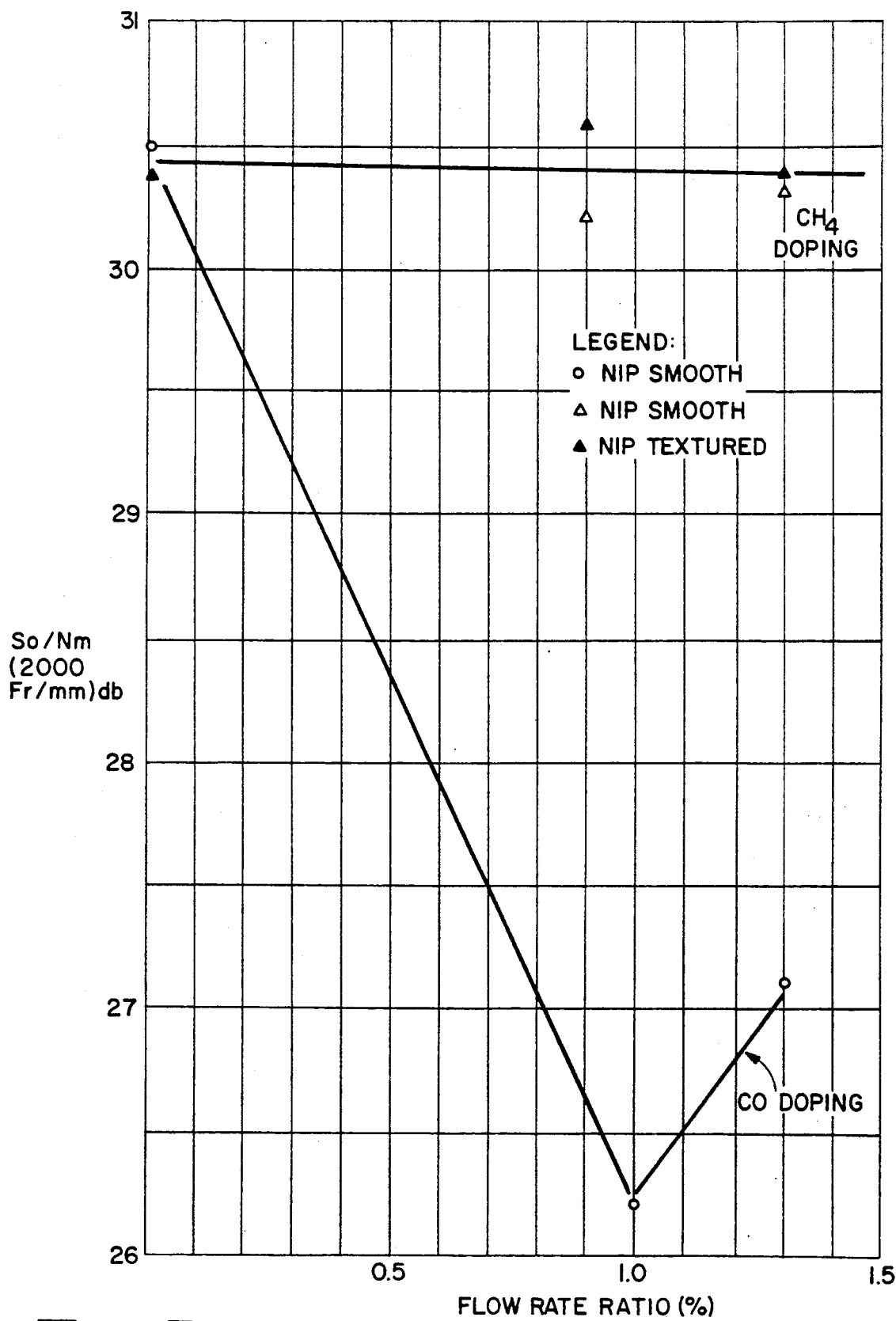
FIG. 5 is an illustration comparing the SNR of CoPtCr disks formed with reactive sputtering of CO to the SNR of disks formed with reactive sputtering of $CH_4$.

The results show that CO doping of CoPtCr (2 different compositions) produces a non-linear response of Hc with CO composition and a degradation in SNR (FIGS. 1, 3 and 5). The use of $CH_4$ to dope the CoPtCr film leads to a linear effect on Hc (FIGS. 2 and 4) and no significant degradation of SNR over the composition tested (FIG. 5). Thus, $CH_4$ doping of CoPtCr films provides superior control of coercivity and does not degrade SNR when used for magnetic films with underlayers (Cr, CrV). It is expected that $CH_4$ doping of other cobalt alloy magnetic layers, such as CoNi and CoCr alloys, should yield similar results to CoPtCr for Hc control.

In addition, while in the preferred embodiment $CH_4$ (methane) is the reactive gas, the invention is also applicable to the use of other hydrocarbon gases. Examples of such hydrocarbon gases would include $C_2H_2$, $C_3H_8$ and $C_4H_{10}$. Also, while the preferred host gas in the sputtering atmosphere is Ar, other host gases, such as Ne, Kr, or Xe, may be possible.

In accordance with the present invention, $CH_4$ and Ar are mixed and then are directed into the sputtering chamber by means of flow controllers. The relative flow rates of $CH_4$ and Ar are controlled so as to control the coercivity of the magnetic layer formed from sputtering targets onto the substrate. The relative flow rates are selected, for a particular magnetic layer composition, based upon the desired coercivity and a previously determined relationship between % $CH_4$ and coercivity. This relationship is determined empirically, as shown for example by FIGS. 2 and 4.

Thus, the process according to the present invention allows thin film cobalt alloy magnetic recording disks having a desired magnetic layer composition and thickness to be fabricated according to a specifically selected coercivity without significant effect on SNR. The coercivity can be selected using the selected % $CH_4$ gas mixture obtained in FIGS. 2 and 4 without the necessity of changing the sputtering targets. The invention provides an additional advantage when it is desired to form a protective hydrogenated carbon overcoat on the disk. Such overcoats may be formed from the reactive sputtering of a carbon target in the presence of an Ar-hydrocarbon gas atmosphere, as described in Japanese Kokais No. 60-155668 and 60-157725. The technique for selectively varying the coercivity in the manner just described is thus compatible with a production system wherein the cobalt alloy magnetic layer and the hydrogenated carbon overcoat are formed in substantially the same sputtering atmosphere.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. In a process for the fabrication of a thin film magnetic recording disk wherein the process includes the step of sputter-depositing a magnetic alloy layer comprising cobalt, platinum and chromium in a sputtering chamber having a host gas atmosphere, an improvement comprising the steps of introducing a hydrocarbon gas into the sputtering chamber and sputter depositing the magnetic alloy layer in the presence of the hydrocarbon gas.

2. The process according to claim 1, wherein the step of introducing the hydrocarbon gas includes the step of introducing methane gas.

3. An improved process according to claim 2, wherein the step of introducing the methane gas includes the step of introducing the methane gas at a fixed predetermined flow rate.

4. A process for the fabrication, by deposition in a sputtering chamber having a host gas atmosphere, of a magnetic recording disk having a magnetic layer comprising cobalt, platinum and chromium and having a predetermined coercivity, the process comprising the steps of:

providing a disk substrate;

introducing hydrocarbon gas into the sputtering chamber at a predetermined flow rate; and sputter-depositing a magnetic layer over the substrate in the presence of the host gas and hydrocarbon gas, the magnetic layer comprising an alloy containing cobalt, platinum and chromium.

5. The process according to claim 4, including the step of, prior to sputter-depositing the magnetic layer, sputter-depositing an underlayer over the substrate.

6. The process according to claim 5, wherein the step of introducing the hydrocarbon gas into the sputtering chamber includes the step of introducing methane.

* * * * *